United States Patent
Sakakibara

[19]

[11] Patent Number: 6,145,037
[45] Date of Patent: Nov. 7, 2000

[54] PC CARD INPUT/OUTPUT DEVICE AND PC CARD CONNECTOR FOR CHANGING ELECTRICAL CONNECTION TO A PC CARD

[75] Inventor: Kazuo Sakakibara, Tokyo, Japan

[73] Assignee: Mitsubishi Denki Kabushiki Kaisha, Tokyo, Japan

[21] Appl. No.: 09/095,503

[22] Filed: Jun. 11, 1998

[30] Foreign Application Priority Data

Dec. 8, 1997 [JP] Japan ................................ 9-337493

[51] Int. Cl.[7] .............................. G06F 13/00; H01R 11/11
[52] U.S. Cl. ............................ 710/102; 710/14; 710/62; 439/159; 439/638; 439/131; 439/76.1; 361/753
[58] Field of Search ............................... 710/102, 14, 62; 361/753; 439/638, 76.1, 131, 159

[56] References Cited

U.S. PATENT DOCUMENTS

| | | | |
|---|---|---|---|
| 5,423,697 | 6/1995 | MacGregor | 439/638 |
| 5,619,660 | 4/1997 | Scheer et al. | 710/102 |
| 5,683,258 | 11/1997 | Takano et al. | 439/159 |
| 5,802,328 | 9/1998 | Yoshimura | 710/102 |
| 5,920,460 | 7/1999 | Oldendorf et al. | 361/753 |
| 5,920,731 | 7/1999 | Pietl et al. | 710/14 |

FOREIGN PATENT DOCUMENTS

06155974  6/1994  Japan .......................................... 15/10

*Primary Examiner*—Daniel H. Pan
*Assistant Examiner*—Te Yu Chen
*Attorney, Agent, or Firm*—Burns, Doane, Swecker & Mathis, LLP

[57] ABSTRACT

A PC Card input/output device comprises a PC Card connector including a socket portion into which a PC Card can get inserted. The socket portion contains a switch which can be fully accommodated within a space defined by inner walls of the socket portion and a notch formed on a PC Card inserted if the upper and lower sides of the PC Card inserted are oriented in proper directions with respect to the socket portion, and which can be mechanically actuated so as not to prevent insertion of a PC Card if the upper and lower sides of the PC Card inserted are oriented in improper directions with respect to the socket portion, so that the switching state of the switch is changed. When the switch state of the switch is changed, a connection switching unit can change a connection between the plurality of connecting terminals of the PC Card connector and a plurality of terminals with which the connection has been set up, before the PC Card inserted is electrically connected to the PC Card connector.

13 Claims, 5 Drawing Sheets

PC CARD INPUT/OUTPUT DEVICE AND PC CARD CONNECTOR FOR CHANGING ELECTRICAL CONNECTION TO A PC CARD

BACKGROUND OF THE INVENTION

1. Field of the Invention

The present invention relates to a PC Card input/output device for use with PC Cards and a PC Card connector, which are used for writing and reading data to and from a PC Card containing a number of storage elements, and, more particularly, to improvements in the convenience of PC Cards.

2. Description of the Prior Art

Figure 7:
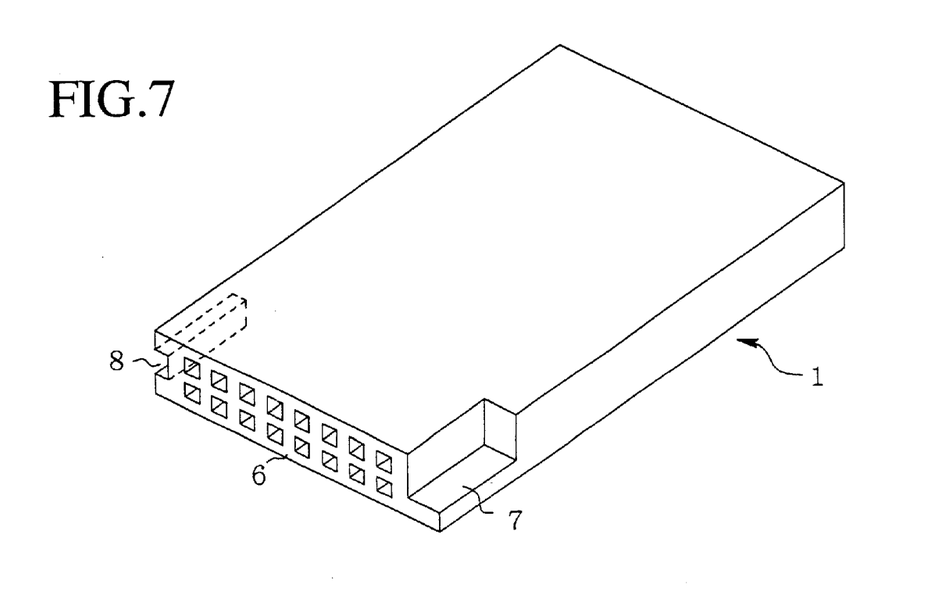
FIG. 7 is an external view of the outward appearance of a PC Card.

Referring next to FIG. 7, there is illustrated an external view of the outward appearance of a PC Card. In the figure, reference numeral 1 denotes a PC Card, 6 denotes a female connector formed on the front side of the PC Card 1 which is to be in the lead when inserted into a PC Card socket, and comprised of a plurality of female connecting terminals, 7 denotes a notch formed on the right (or upper) side and one lateral side of the PC Card 1 and extending along the length of the PC Card 1 from the front side of the PC Card 1 and, and 8 denotes a guide slit formed on the other lateral side of the PC Card 1 and extending along the length of the PC Card 1 from the front side of PC Card 1.

Figure 8:
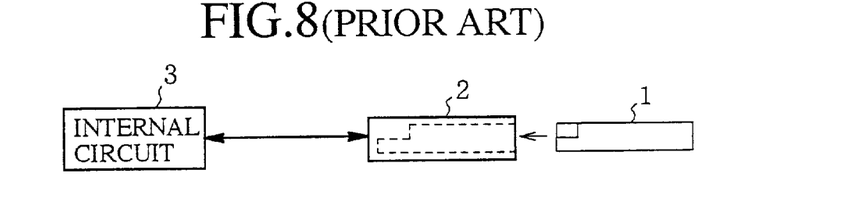
FIG. 8 is a block diagram showing the structure of a prior art PC Card input/output device for use with PC Cards, and a peripheral circuit.
Figure 9:
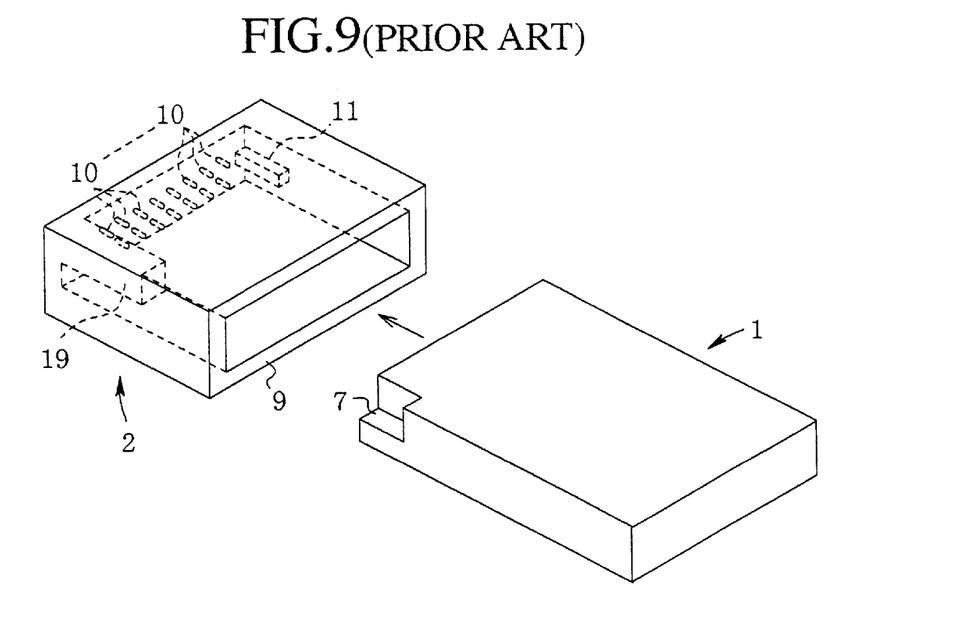
FIG. 9 is a perspective view showing the structure of the prior art PC Card connector shown in FIG. 8.

Referring next to FIG. 8, there is illustrated a block diagram showing the structure of a prior art input/output device for use with PC Cards and a peripheral circuit. In the figure, reference numeral 2 denotes a PC Card connecter into which the PC Card 1 gets inserted, having a male connector which is electrically connected with the female connector 6 of the PC Card 1, and 3 denotes an internal circuit which can be electrically connected with the PC Card 1 by way of the PC Card connector 2. Referring next to FIG. 9, there is illustrated a perspective view showing the structure of the prior art PC Card connector 2 shown in FIG. 8. In FIG. 9, reference numeral 9 denotes a socket portion into which the PC Card 1 gets inserted so that the female connector 6 of the PC Card 1 is electrically connected to the PC Card connector 2, 10 denotes a plurality of male connecting terminals projected from an inner wall of the PC Card connector 2 at the back of the socket 9, 11 denotes a guide rail which can be engaged with the guide slit 8 of the PC Card 1 so as to guide the guide slit 8 when the PC Card 1 gets inserted into the socket portion 9, and 19 denotes an insertion blocking member which can be engaged with the notch 7 of the PC Card 1 when the PC Card 1 gets inserted into the socket so as to prevent the PC Card 1 from being pressed against the inner wall of the PC Card connector 2 after the plurality of female connecting terminals of the PC Card 1 are surely engaged with the plurality of male connecting terminals 10 of the PC Card connector 2, respectively.

In operation, the PC Card 1 gets inserted into the socket portion 9 with the upper side of the PC Card 1 pointing upwards while the guide slit 8 of the PC Card 1 is engaged with the guide rail 11. Once the PC Card 1 is inserted into the socket portion 9 as far forward as possible until the notch 7 is engaged with the insertion blocking member 19, the PC Card 1 is stopped and the plurality of female connecting terminals of the connector 6 of the PC Card 1 are brought into contact with and therefore electrically connected to the plurality of male connecting terminals 10 of the PC Card connector 2, respectively.

As a result, the internal circuit 3 is connected to the plurality of female connecting terminals of the PC Card 1 by way of the PC Card connector 2, so that the PC Card 1 can furnish and receive data to and from the internal circuit 3 in response to reading and writing requests from the internal circuit 3.

It is clear from FIG. 9 that the PC Card 1 cannot get inserted into the socket portion 9 with the reverse or lower side of the PC Card 1 pointing upwards because the front edge of the PC Card 1 is brought into contact with the insertion blocking member 19 and therefore the insertion of the PC Card 1 is stopped on the way to the plurality of male connecting terminals 10. The plurality of female connecting terminals of the PC Card 1 thus cannot reach the plurality of male connecting terminals 10 of the PC Card connector 2.

As previously explained, when utilizing a PC Card 1 and a PC Card connector 2 which comply with the PC Card Standard, the PC Card 1 can get inserted into the socket portion 9 of the PC Card connector 2 only when making the upper side of the PC Card 1 point upwards. As a result, the PC Card 1 can be connected to the internal circuit while a certain connection between the PC Card 1 and the internal circuit is established.

While the combination of the above-mentioned prior art PC Card and the PC Card connector can prevent the user from inserting the PC Card while mistaking the lower side of the PC Card for the upper side of the PC Card, and therefore prevent improper electrical connections between the PC Card and the PC Card connector, there is a problem in that every time the user does an improper insertion the user has to insert the PC Card again by turning the PC Card upside down, resulting in reduction in the convenience of the PC Card. Especially, when the PC Card connecter is disposed such that its insertion opening is running longitudinally, it is difficult for the user to determine in which direction the upper and lower sides of the PC Card should be oriented, resulting in substantial reduction in the convenience of the PC Card.

Figure 10:
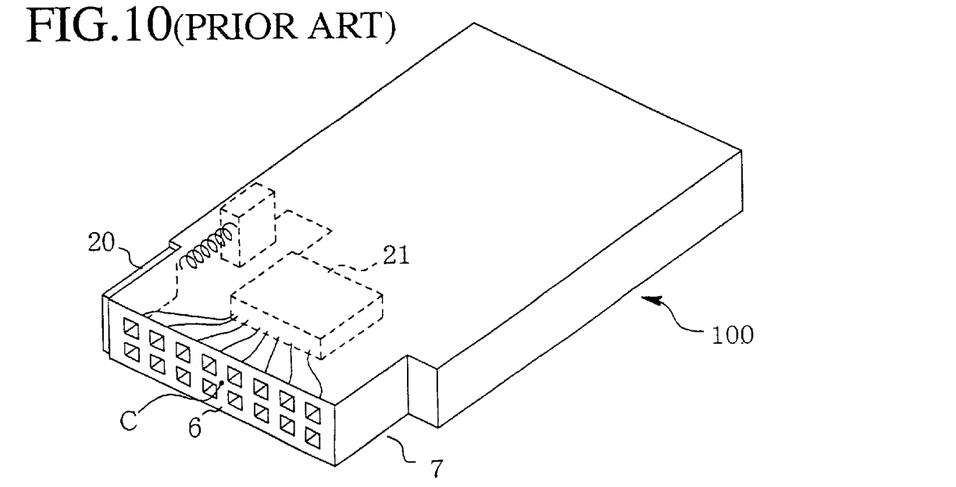
FIG. 10 is a perspective view showing the outward appearance of an improved prior art PC Card.

Japanese Patent Application Laying Open (KOKAI) No. 6-155974 discloses an improved prior art PC Card to solve the above problem. Referring next to FIG. 10, there is illustrated a perspective view showing the outward appearance of the PC Card as disclosed in the reference. In FIG. 10, reference numeral 20 denotes a switch disposed on one lateral side of the improved PC Card 100 which is opposite to the other lateral side on which a notch 7 is formed. The switch 20 can slide on the lateral side of the PC Card 100 opposite in direction to the travel of the PC Card 100. The switch 20 extends such that its free end reaches the front side of the PC Card 100 which is to be in the lead when the PC Card 100 gets inserted into a PC Card socket. Reference numeral 21 denotes a connection switching unit connected between the female connector 6 and a memory disposed inside the PC Card 100, responsive to a switching signal from the switch 20, for changing the connection between the plurality of female connecting terminals of the PC Card 100 and the pins of the built-in memory. To be more specific, the connection switching unit 21 performs a switching in such a manner that the connecting target with which each of the pins of the built-in memory is to be connected is switched from one female connecting terminal of the PC Card 100 to another female connecting terminal symmetric to the former female connecting terminal with respect to the center C of the front side of the PC Card 100.

When the user inserts the PC Card 100 into the PC Card connector with the upper side of the PC Card pointing upwards, the PC Card 100 is properly mounted into the PC Card connector, like the above-mentioned prior art PC Card as shown in FIG. 9. On the other hand, when the user inserts the PC Card 100 into the PC Card connector with the reverse side of the PC Card pointing upwards, the free end of the switch 20 is brought into contact with the insertion blocking member 19. When the user further pushes the PC Card 100 into the back of the socket, the female connector 6 of the PC Card 100 is electrically connected to the PC Card connector 2. In the PC Card 100, the switch 20 then generates a switching signal in response to the travel of the switch 20, with the result that the connection switching unit 20 changes the connection between the plurality of female connecting terminals and the pins of the built-in memory in such a manner that the connecting target with which each of the pins of the built-in memory is to be connected is switched from one female connecting terminal to another female connecting terminal symmetric to the former female connecting terminal with respect to the center C of the front side of the PC Card 100.

Accordingly, even though such the prior art PC Card 100 is inserted improperly into a PC Card socket with the reverse side of the PC Card 100 pointing upwards, the improved PC Card 100 can be electrically connected to the PC Card connector while the connection between the built-in memory and the internal circuit 3 by way of the female connector 6 and PC Card connector 2 is established in the same manner as the case where the PC card 100 is properly inserted into the PC Card socket with the right side of the PC Card 100 pointing upwards because the electrical coupling between the plurality of female connecting terminals of the female connector 6 of the PC card 100 and the plurality of male connecting terminals 10 of the PC Card connector 2 has been changed and the connection between the plurality of female connection terminals of the PC Card 100 and the pins of the built-in memory has been changed similarly. Thus the PC Card 100 can receive and furnish data from and to the internal circuit 3 reliably in response to reading and writing requests from the internal circuit 3 regardless of how the PC Card 100 inserted into the PC Card socket is oriented.

While the improved PC Card enabling the improper insertion offers an advantage of allowing an internal circuit to read and write data from and to the PC Card inserted into a PC Card socket regardless of how the PC Card inserted is oriented, it cannot improve the operability of prior art PC Cards which have become widely available and which complies with the PC Card Standard, instead, there is a fear that the introduction of the improved PC Card on the market causes a state of disorder wherein the improved PC Cards enabling the improper insertion coexist with existing prior art PC Cards and therefore users are required to use both the improved PC Cards and prior art PC Cards each in its proper way, resulting in reduction in the general convenience of PC Cards.

SUMMARY OF THE INVENTION

The present invention is made to overcome the above problem. It is therefore an object of the present invention to provide a PC Card input/output device and a PC Card connector, capable of allowing electronic equipment into which the PC Card input/output device or the PC Card connector can be incorporated to read and write data from and to any type of PC Card, including a PC Card which complies with an existing version of the PC Card Standard, regardless of how the PC Card is oriented within a PC Card socket into which the PC Card gets inserted, resulting in preventing a state of disorder caused by the introduction of the improved PC Card mentioned above on the market.

In accordance with one aspect of the present invention, there is provided a PC Card input/output device used for reading and writing data from and to a PC Card, comprising: a PC Card connector including a socket portion into which a PC Card can get inserted, and a plurality of connecting terminals which are disposed on an inner wall at the back of the socket portion and which can be electrically connected to a plurality of connecting terminals of a PC Card inserted into the socket portion; a detecting circuit contained in the socket portion, for detecting in which direction upper and lower sides of a PC Card, which has been inserted into the socket portion of the PC Card connector, are oriented with respect to the socket portion so as to generate a detection signal indicating the direction in which the upper and lower sides of the PC Card inserted are oriented with respect to the socket portion of the PC Card connector; and a connection switching unit, responsive to the detection signal from the detecting circuit, for changing a connection between the plurality of connecting terminals of the PC Card connector and a plurality of terminals with which the connection has been set up.

In accordance with a preferred embodiment of the present invention, the detecting circuit includes a switch which can be fully accommodated within a space defined by inner walls of the socket portion and a notch formed on a PC Card inserted if the upper and lower sides of the PC Card inserted are oriented in proper directions with respect to the socket portion of the PC Card connector, and which can be mechanically actuated so as not to prevent insertion of a PC Card if the upper and lower sides of the PC Card inserted are oriented in improper directions with respect to the socket portion of the PC Card connector, so that the switching state of the switch is changed. The switch can be mechanically actuated before a plurality of connecting terminals of a PC Card inserted into the socket portion of the PC Card connector are electrically connected to the plurality of connecting terminals of the PC Card connector, respectively.

In accordance with another aspect of the present invention, there is provided a PC Card connector comprising: a socket portion into which a PC Card can get inserted; a plurality of connecting terminals disposed on an inner wall at the back of the socket portion; and a detecting circuit contained in the socket portion, for detecting in which direction upper and lower sides of a PC Card, which has been inserted into the socket portion, are oriented with respect to the socket portion so as to generate a detection signal indicating the direction in which the upper and lower sides of the PC Card inserted are oriented with respect to the socket portion.

In accordance with a preferred embodiment of the present invention, the detecting circuit includes a switch which can be fully accommodated within a space defined by inner walls of the socket portion and a notch formed on a PC Card inserted if the upper and lower sides of the PC Card inserted are oriented in proper directions with respect to the socket portion, and which can be mechanically actuated so as not to prevent insertion of a PC Card if the upper and lower sides of the PC Card inserted are oriented in improper directions with respect to the socket portion, so that the switching state of the switch is changed. The switch can be mechanically actuated before a plurality of connecting terminals of a PC Card inserted into the socket portion are electrically connected to the plurality of connecting terminals of the PC Card connector, respectively.

Further objects and advantages of the present invention will be apparent from the following description of the preferred embodiments of the invention as illustrated in the accompanying drawings.

DETAILED DESCRIPTION OF THE PREFERRED EMBODIMENT

Figure 1:
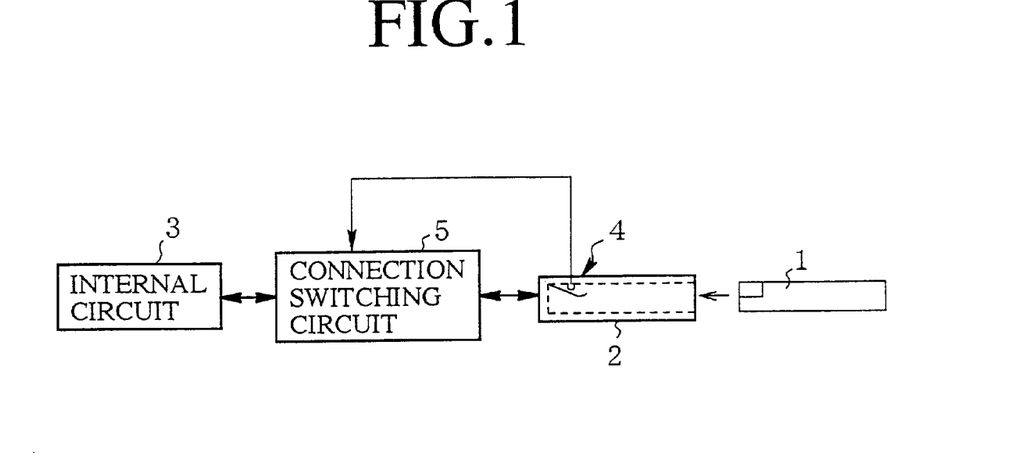
FIG. 1 is a block diagram showing a PC Card input/output device for use with PC Cards, for reading and writing data from and to a PC Card, according to an embodiment of the present invention, and a peripheral circuit.

Referring next to FIG. 1, there is illustrated a block diagram showing a PC Card input/output device for use with PC Cards, for reading and writing data from and to a PC Card, according to an embodiment of the present invention, and a peripheral circuit. In the figure, reference numeral 1 denotes a PC Card, 2 denotes a PC Card connector into which the PC Card 1 can get inserted, and to which the female connector 6 of the PC Card 1 can be electrically connected, 3 denotes an internal circuit for reading and writing data from and to the PC Card 1 inserted into the PC Card connector 2, 4 denotes a detecting circuit for detecting the reverse or lower side of the PC Card 1 inserted into the PC Card connecter 2 and for generating a detection signal active LOW when it detects the lower side of the PC Card 1. In other words, by detecting the lower side of the PC Card 1 inserted, the detecting circuit 4 detects in which direction the upper and lower sides of the PC Card 1, which has been inserted into the PC Card connector 2, are oriented with respect to the PC Card connector 2. Reference numeral 5 denotes a connection switching unit electrically connected between the PC Card connector 2 and the internal circuit 3, for changing a connection between a plurality of male connecting terminals of the PC Card connector 2 and a plurality of terminals (not shown) coupled to the internal circuit 3 in response to the detection signal from the detecting circuit 4.

Figure 2:
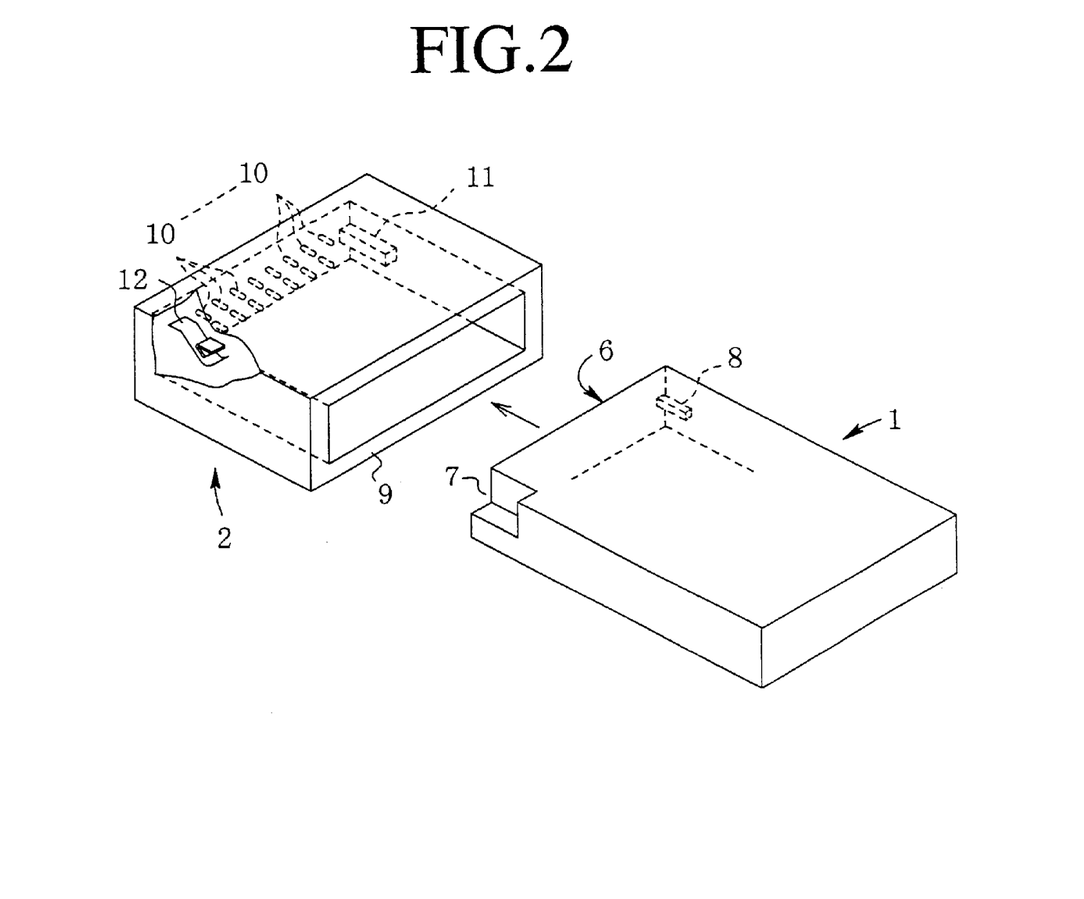
FIG. 2 is a perspective view, partly cutaway, of a PC Card connector according to the embodiment of the present invention and a PC Card which will get inserted into the PC Card connector.

Referring next to FIG. 2, there is illustrated a perspective view, partly cutaway, of the PC Card connector 2 according to the embodiment of the present invention and the PC Card 1. In the figure, reference numeral 6 denotes a connector disposed on the front surface of the PC Card 1 which is to be in the lead when the PC Card gets inserted into the PC Card connector 2, and provided with a plurality of female connecting terminals, 7 denotes a notch formed on the upper side and one lateral side of the PC Card 1, and extending along the length of the PC Card 1 from the front side of the PC Card 1, and 8 denotes a guide slit formed on the other lateral side of the PC Card 1 and extending along the length of the PC Card 1 from the front side of the PC Card 1. Furthermore, reference numeral 9 denotes a socket portion into which the PC Card 1 can get inserted, 10 denotes a plurality of male connecting terminals which are projected from the inner wall at the back of the socket portion 9, and which can be electrically connected to the female connector 6 of the PC Card 1 when the PC Card gets inserted into the socket portion 9, 11 denotes a guide rail which can be engaged with the guide slit 8 of the PC Card 1 so as to guide the guide slit 8 when the PC Card 1 gets inserted into the socket portion 9, and 12 denotes a switch which can be accommodated within a space defined by the notch 7 and inner walls of the socket portion 9 when the PC Card 1 gets inserted into the socket portion 9 properly, for example, with the upper side of the PC Card 1 pointing upwards.

Figure 3:
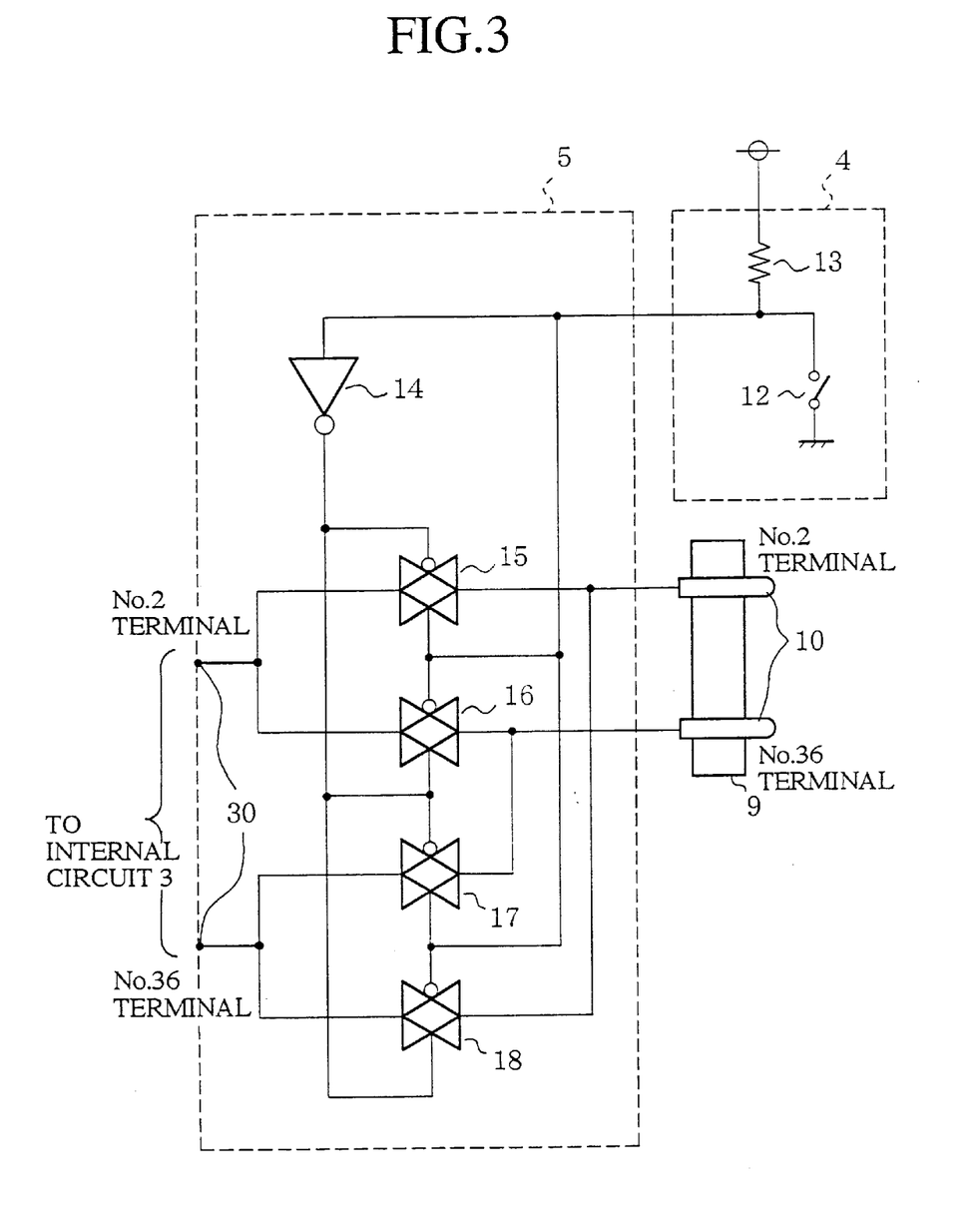
FIG. 3 is a schematic circuit diagram of a main part of the PC Card input/output device according to the embodiment of the present invention shown in FIG. 1.

Referring next to FIG. 3, there is illustrated a schematic circuit diagram of a main part of the PC Card input/output device according to the embodiment of the present invention. In the figure, reference numeral 13 denotes a pull-up resistor by way of which one terminal of the switch 12 shown in FIG. 2 is connected to a high power supply, 14 denotes an inverter for inverting a detection signal, generated by the pull-up resistor 13 and the switch 12, indicating that the switch 12 has detected the lower side of a PC Card 1 inserted into the socket portion 9, and 15 through 18 each denotes an analog switch for electrically connecting a corresponding male connecting terminal disposed in the socket portion 9 with one terminal 30 coupled to the internal circuit 3 in response to the detection signal from the detecting circuit 4, or the output of the inverter 14, i.e., the inverted detection signal.

Figure 4:
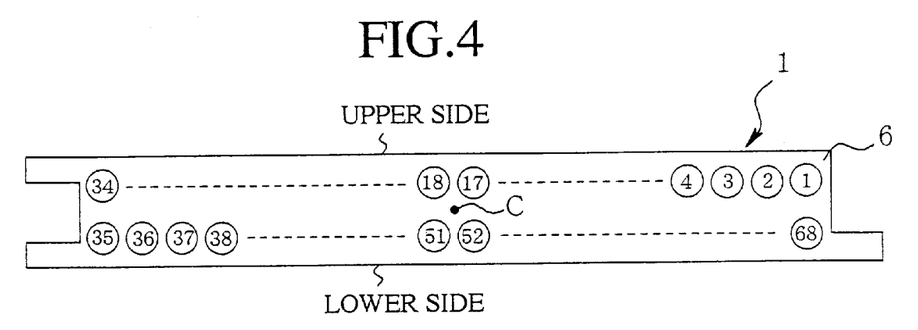
FIG. 4 is a view showing the pin configuration of a 68-pin female connector of the PC Card shown in FIG. 2.

Referring next to FIG. 4, there is illustrated a view showing the pin configuration of the 68-pin female connector 6 of the PC Card 1. As shown in the figure, the PC Card 1 has two rows of 34 female connecting terminals. In this case, when viewing the front side of the PC Card 1 with the upper side of the PC Card 1 pointing upwards, the most upper right female terminal of the connector 6 is referred to as No. 1 terminal, the most upper left terminal is referred to as No. 34 terminal, the most lower left terminal is referred to as No. 35 terminal, and the most lower right terminal is referred to as No. 68 terminal.

The connection switching unit 5 shown in FIG. 3 is so constructed as to change the connection between the plurality of male connecting terminals 10 of the PC Card connector 2 and the plurality of terminals 30 connected to the internal circuit 3. To be more specific, the connection switching unit 5 performs a switching in such a manner that the connecting target with which each of the plurality of terminals 30 coupled to the internal circuit 3 is to be connected is switched from one male connecting terminal of the PC Card connector 2 to another male connecting terminal symmetric to the former male connecting terminal with respect to the center C of the front side of the PC Card 1. For example, in response to the detection signal asserted LOW from the detection circuit 4, the connecting target with which No. 2 terminal coupled to the internal circuit 3 is to be connected is switched from No. 2 male connecting terminal of the PC Card connector 2 to No. 36 male connecting terminal, as shown in FIG. 3.

Figure 5A:
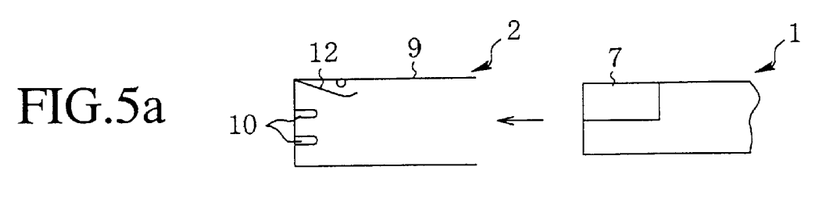
FIG. 5a is a view showing a previous state prior to insertion of the PC Card into the PC Card connector according to the embodiment of the present invention with the upper side of the PC Card pointing upwards.
Figure 5B:
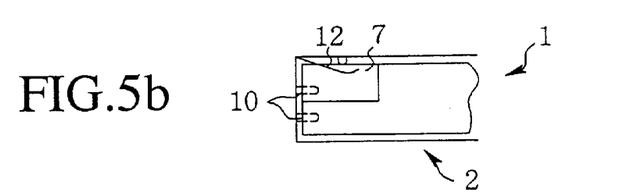
FIG. 5b is a view showing a state in which the PC Card has been inserted into the PC Card connector with the upper side of the PC Card pointing upwards.

Referring next to FIG. 5a, there is illustrated a view showing a previous state prior to insertion of the PC Card 1 into the PC Card connector 2 according to the embodiment of the present invention with the upper side of the PC Card 1 pointing upwards. FIG. 5b shows a state in which the PC Card 1 has been inserted into the PC Card connector 2 with the upper side of the PC Card 1 pointing upwards. As can be seen from FIG. 5b, when the PC Card 1 is inserted into the socket portion 9 with the upper side of the PC Card 1 pointing upwards, the switch 12 is fully accommodated within a space defined by the notch 7 of the PC Card 1 and inner walls of the socket portion 9, and therefore it is not actuated. In this case, the detecting circuit 4 does not generate a detection or switching signal. That is, the input of the inverter 14 is held HIGH. Thus the plurality of female connecting terminals of the PC Card 1 are electrically connected to the plurality of terminals 30 coupled to the internal circuit 3 without a preceding switching operation. For example, in the case of No. 2 and No. 36 pins of the PC Card connector 2, the analog switches 15 and 17 are held in the ON state according to the output of the inverter 14 at a LOW logic level and the analog switches 16 and 18 are held in the OFF state according to the output at a HIGH logic level from the detecting circuit 4, as can be seen from FIG. 3. As a result, No. 2 and No. 36 pins of the PC Card connector 2, i.e., No. 2 and No. 36 female terminals of the PC Card 1 are electrically connected to No. 2 and No. 36 terminals, respectively, which are coupled to the internal circuit 3.

Figure 6A:
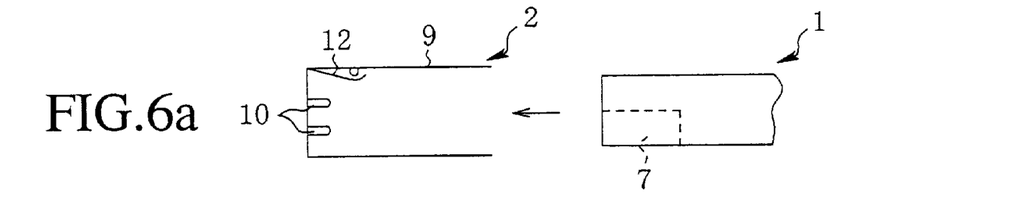
FIG. 6a is a view showing a previous state prior to insertion of the PC Card into the PC Card connector with the lower side of the PC Card pointing upwards.
Figure 6B:
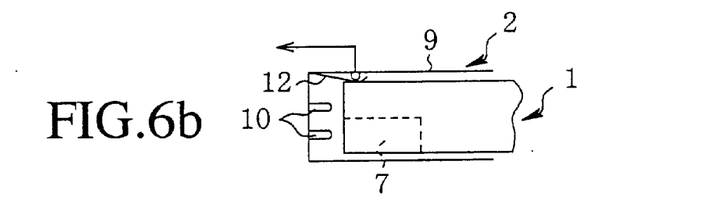
FIG. 6b is a view showing a state in which the PC Card has been inserted in partway into the PC Card connector with the lower side of the PC Card pointing upwards.
Figure 6C:
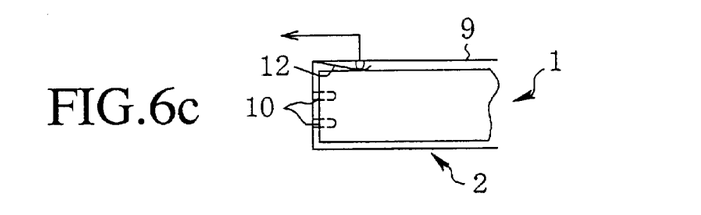
FIG. 6c is a view showing a state in which the PC Card has been inserted into the PC Card connector with the lower side of the PC Card 1 pointing upwards until the female connector of the PC Card is electrically connected to the PC Card connector.

Referring next to FIG. 6a, there is illustrated a view showing a previous state prior to insertion of the PC Card 1 into the PC Card connector 2 with the lower side of the PC Card 1 pointing upwards. FIG. 6b shows a state in which the PC Card 1 has been inserted in partway into the PC Card connector 2 with the lower side of the PC Card 1 pointing upwards. FIG. 6c shows a state in which the PC Card 1 has been inserted into the PC Card connector 2 with the lower side of the PC Card 1 pointing upwards until the female connector of the PC Card 1 is electrically connected to the male connector 2. As can be seen from FIGS. 6b and 6c, when the PC Card 1 is inserted into the socket portion 9 with the lower surface of the PC Card 1 pointing upwards, the switch 12 is not accommodated within the space defined by the notch 7 of the PC Card 1 and inner walls of the socket portion 9. Instead, the switch 12 is brought into contact with the front edge of the PC Card 1 and is then actuated mechanically so as not to prevent the insertion of the PC Card 1 into the back of the socket portion 9, so that the switching state of the switch 12 is changed, that is, the switch 12 is closed. Preferably, the switch 12 includes a movable contact having a free end bending toward a fixed contact, as shown in figures. As a result, the detecting circuit 4 furnishes a detection or switching signal asserted LOW. In response to the detection signal at a LOW logic level, the connection switching circuit 5 changes the connection between the plurality of male connecting terminals 10 of the PC Card connector 2 and the plurality of terminals of the internal circuit 3 in such a manner that the connecting target with which each of the plurality of terminals 30 coupled to the internal circuit 3 is to be connected is switched from one corresponding male connecting terminal of the PC Card connector 2 to another male connecting terminal symmetric to the former male connecting terminal with respect to the center C of the front side of the PC Card 1. For example, in the case of No. 2 and No. 36 pins of the PC Card connector 2, the analog switches 15 and 17 are turned off in response to the output of the inverter 14 at a HIGH logic level, and simultaneously the analog switches 16 and 18 are turned on in response to the detection signal at a LOW logic level from the detecting circuit 4, as can be seen from FIG. 3. As a result, No. 2 and No. 36 pins of the PC Card connector 2, i.e., No. 2 and No. 36 female terminals of the PC Card 1 are electrically connected to No. 36 and No. 2 terminals, respectively, which are coupled to the internal circuit 3.

As previously explained, the PC Card input/output device according to the embodiment of the present invention comprises a detection circuit 4 for detecting in which direction the upper and lower sides of a PC Card 1 inserted into the socket portion 9 of a PC Card connector 2 are oriented with respect to the socket portion 9 so as to generate a detection signal indicating the detection result, and a connection switching circuit 5 for changing a connection between a plurality of connecting terminals of the PC Card connector and a plurality of terminals with which the connection has been set up in response to the detection signal from the detection circuit 4, the detection circuit 4 including a switch 12 which can be fully accommodated within a space defined by inner walls of the socket portion 9 and a notch 7 formed on a PC Card 1 when the upper and lower sides of the PC Card 1 inserted into the socket portion 9 are oriented in proper directions with respect to the socket portion 9, and which can be mechanically actuated so as not to prevent insertion of a PC Card 1 when the upper and lower sides of the PC Card 1 inserted into the socket portion 9 are oriented in improper directions with respect to the socket portion 9, so that the switching state of the switch 12 is changed. Accordingly, when the user uses a PC Card which complies with an existing version of the PC Card standard, the user is allowed to enter the PC Card with the PC Card turned upside down. In addition, the electronic equipment into which the PC Card gets inserted can read and write data from and to the PC Card through an internal circuit in the same manner as the case where the PC Card is properly inserted with the upper and lower sides of the PC Card pointing in proper directions. Thus the PC Card input/output device and PC Card connector according to the present invention make it possible for electronic equipment to precisely read and write data from and to any type of PC Card regardless of how the PC Card is oriented within a PC Card socket into which the PC Card gets inserted, resulting in preventing a state of disorder caused by the introduction of the improved prior art PC Card mentioned above on the market.

Furthermore, since the switch 12 can generate a detection signal before the plurality of male connecting terminals 10 of the PC Card connector 2 are connected to the plurality of female connecting terminals of the PC Card 1, the connection switching circuit 5 can change the connection between the plurality of male connecting terminals 10 and the internal circuit 3 before the plurality of male connecting terminals 10 of the PC Card connector 2 are connected to the plurality of female connecting terminals of the PC Card 1. Accordingly, when the PC Card 1 gets inserted, the female connector 6 of the PC Card is electrically connected to the PC Card connector 2 after a connection between the plurality of male connecting terminals 10 and the internal circuit 3 is established and made stable. This results in the prevention of switching noise into the PC Card 1, and therefore the prevention of harmful influences exerted upon the PC Card 1, such as the adverse effect of erasing data stored in the PC Card 1.

Many widely different embodiments of the present invention may be constructed without departing from the spirit and scope of the present invention. It should be understood that the present invention is not limited to the specific embodiments described in the specification, except as defined in the appended claims.

What is claimed is:

1. A PC Card input/output device used for reading and writing data from and to a PC Card, comprising:

a PC Card connector including a socket portion into which said PC Card is to be inserted, and a plurality of first connecting terminals which are disposed on an inner wall at the back of said socket portion and which can be electrically connected to a plurality of second connecting terminals of said PC Card inserted into said socket portion;

a detecting means contained in said socket portion of said PC Card connector, to detect an orientation of an arrangement of said second connecting terminals inserted into said PC Card connector with respect to said first connecting terminals so as to generate a detection signal indicating said orientation; and connection switching means, responsive to the detection signal from said detecting means, for changing a connection between said first connecting terminals of said PC Card connector and a plurality of terminals to be connected to a circuit that exchanges said data from and to said PC Card.

2. The PC Card input/output device according to claim 1, wherein said detecting means includes a switch which is accommodated within a space defined by inner walls of said socket portion and a notch formed on said PC Card inserted if an upper and a lower sides of said PC Card inserted are oriented in a first orientation with respect to said socket portion of said PC Card connector, said switch mechanically actuated so as not to prevent insertion of said PC Card if the said PC Card inserted is oriented in a second orientation with respect to said socket portion of said PC Card connector, so that a switching state of said switch is changed.

3. The PC Card input/output device according to claim 2, wherein said switch is mechanically actuated before said second connecting terminals of said PC Card inserted into said socket portion of said PC Card connector are electrically connected to said first connecting terminals of said PC Card connector.

4. A PC Card connector comprising:

a socket portion into which a PC Card can be inserted;

a plurality of first connecting terminals disposed on an inner wall at the back of said socket portion; and detecting means contained in said socket portion, for detecting whether or not a plurality of second connecting terminals of said PC Card inserted into said socket portion is in one of two orientations relative to said PC Card connector so as to generate a detection signal indicating an orientation of said second connecting terminals.

5. The PC Card connector according to claim 4, wherein said detecting means includes a switch which is accommodated within a space defined by inner walls of said socket portion and a notch formed on said PC Card inserted if an upper and a lower sides of said PC Card inserted are oriented in a first orientation with respect to said socket portion, said switch mechanically actuated so as to not to prevent insertion of said PC Card if the upper and lower sides of said PC Card inserted are oriented in a second orientation with respect to said socket portion, so that a switching state of said switch is changed.

6. The PC Card connector according to claim 5, wherein said switch is mechanically actuated before said second connecting terminals of said PC Card inserted into said socket portion are electrically connected to said first connecting terminals of said PC Card connector, respectively.

7. The PC Card input/output device according to claim 1, wherein said PC Card has a specific arrangement of said second connecting terminals with respect to said socket portion and is without an automatic switch means that changes electrical connection to said first connecting terminals in case of reverse connection to said first connecting means.

8. An electronic apparatus reading or writing data from or to a removable peripheral circuit, comprising:

a plurality of first terminals;

an internal circuit, electrically connected to said first terminals and communicating with said removable peripheral circuit via said plurality of first terminals when a plurality of second terminals of said removable peripheral circuit is connected to said first terminals;

a socket orienting said second terminals to said first terminals; and a switch circuit connected between said internal circuit and two of said first terminals, and switching an electrical connection between said internal circuit and either of said two of first terminals in accordance with an orientation of said second terminals inserted into said socket.

9. The electronic apparatus according to claim 8, wherein said switch circuit switches electrical connection between said internal circuit and either of said two of first terminals before said second terminals connect to said first terminals.

10. The electronic apparatus according to claim 8, wherein said switch circuit comprises:

a detector detecting said orientation so as to generate an orientation signal;

a inverter connected to said detector and inverting said direction signal as an inverted signal;

a first switch element connected to said internal circuit and said two of first terminals and switching a connection between said internal circuit and either of said two of first terminals based on said inverted signal; and a second switch element connected to said internal circuit and said two of first terminals and switching a connection between said internal circuit and either of said two of first terminals based on said orientation signal.

11. The electronic apparatus according to claim 10, further comprises an inlet spaced from said socket and from which said second terminals are inserted to connect to said first terminals, wherein said first terminals are disposed inside of said inlet, and said detector comprises a third switch disposed at a position where said third switch activates before said first terminals and second terminals are electrically connected when said second terminals are being inserted into said inlet.

12. The electronic apparatus according to claim 11, wherein said third switch disposed at said position where a tip of said third switch is between said inlet and said first terminals.

13. The electronic apparatus according to claim 8, wherein said switch circuit comprises a third switch which is accommodated within a space defined by inner walls adjacent to said socket and a notch formed on a case of said peripheral circuit inserted if an upper and a lower side of said inserted peripheral circuit are oriented in a first orientation with respect to said socket, said third switch mechanically actuated so as to not to prevent insertion of said peripheral circuit if the upper and lower sides of said peripheral circuit inserted are oriented in a second orientation with respect to said socket portion, so that a switching state of said switch is changed.

* * * * *